United States Patent
Schreck

(10) Patent No.: US 12,002,504 B2
(45) Date of Patent: Jun. 4, 2024

(54) ISOLATION OF LOCAL LINES OF SENSE AMPLIFIERS

(71) Applicant: MICRON TECHNOLOGY, INC., Boise, ID (US)

(72) Inventor: John Schreck, Boise, ID (US)

(73) Assignee: Micron Technology, Inc., Boise, ID (US)

(*) Notice: Subject to any disclaimer, the term of this patent is extended or adjusted under 35 U.S.C. 154(b) by 198 days.

(21) Appl. No.: 17/563,229

(22) Filed: Dec. 28, 2021

(65) Prior Publication Data

US 2023/0206990 A1    Jun. 29, 2023

(51) Int. Cl.
*G11C 11/4091* (2006.01)
*G11C 11/408* (2006.01)

(52) U.S. Cl.
CPC ...... *G11C 11/4091* (2013.01); *G11C 11/4085* (2013.01)

(58) Field of Classification Search
CPC .................. G11C 11/4091; G11C 11/4085
See application file for complete search history.

(56) References Cited

U.S. PATENT DOCUMENTS

| | | | | |
|---|---|---|---|---|
| 5,313,426 A | * | 5/1994 | Sakuma | G11C 11/4091 365/207 |
| 5,619,465 A | * | 4/1997 | Nomura | G11C 7/065 365/208 |
| 5,646,900 A | * | 7/1997 | Tsukude | G11C 5/146 365/207 |
| 5,822,262 A | * | 10/1998 | Hashimoto | G11C 11/4091 365/207 |
| 5,831,912 A | * | 11/1998 | Mueller | G11C 5/025 365/207 |
| 6,195,302 B1 | * | 2/2001 | Hardee | G11C 7/065 365/194 |
| 6,707,729 B2 | * | 3/2004 | Schreck | G11C 11/4091 365/207 |
| 6,859,405 B2 | * | 2/2005 | Lee | G11C 7/06 365/205 |
| 9,135,964 B2 | * | 9/2015 | Ferrant | G11C 7/12 |
| 9,410,901 B2 | * | 8/2016 | Chuang | H01L 27/14645 |

* cited by examiner

*Primary Examiner* — Son L Mai
(74) *Attorney, Agent, or Firm* — Dorsey & Whitney LLP

(57) ABSTRACT

Components of sense amplifiers may share contacts that couple the components to a global line via a local line. In some examples, the components may be pull-down circuits of a same sense amplifier or pull-down circuits of adjacent sense amplifiers. The shared contact may include a transistor or a resistance between the local line and the global line. In some examples, the global line may be an RNL line. The transistor or resistance may reduce the impact of voltage across the components from affecting the global line and/or reduce the impact of voltage changes on the global line on the individual components.

20 Claims, 6 Drawing Sheets

ISOLATION OF LOCAL LINES OF SENSE AMPLIFIERS

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), which in turn may be coupled to a sense amplifier. Along with the digit line coupled to the memory cell, a second, complimentary digit line may also be coupled to the sense amplifier. The use of complimentary digit lines may be useful for providing a reference voltage level to better distinguish the value being read from/written to the memory cell.

The size of memory cells and/or the magnitude of the physical signals stored thereon continues to decrease as the demand for smaller and lower power devices increases. Accordingly, sense amplifiers may also decrease in size and/or spaced more closely together in the memory. Additionally or alternatively, the sense amplifiers may be required to accurately sense smaller magnitude physical signals on the memory cells. One or more of these factors may increase the risk of interference between sense amplifiers, which may cause sense errors in the memory.

DETAILED DESCRIPTION

As disclosed herein, local activation lines associated with sense amplifiers may be coupled to a global activation line via a resistance. The local lines may be included in shared contacts between devices (e.g., components), such as pull-down circuits and/or transistors, of a same sense amplifier or adjacent sense amplifiers. Providing resistance in the shared contact between the local activation lines of the sense amplifiers from the global activation line may reduce voltage changes on the global line can occur for the sense amplifiers when sensing data from digit lines, and reduce the influence of voltage changes on the global activation line on individual sense amplifiers. In some applications, this may reduce sensing errors. As used herein, a shared contact refers to one or more features electrically coupled to two or more devices. For example, a shared contact may include an area or volume of conductive material, one or more conductive traces, wires, or a combination thereof coupled to both a transistor of a sense amplifier and another transistor of the sense amplifier. In another example, the shared contact may include a conductive material and a resistive material coupled to both transistors of the sense amplifier. Other examples of shared contacts are described herein.

Figure 1:
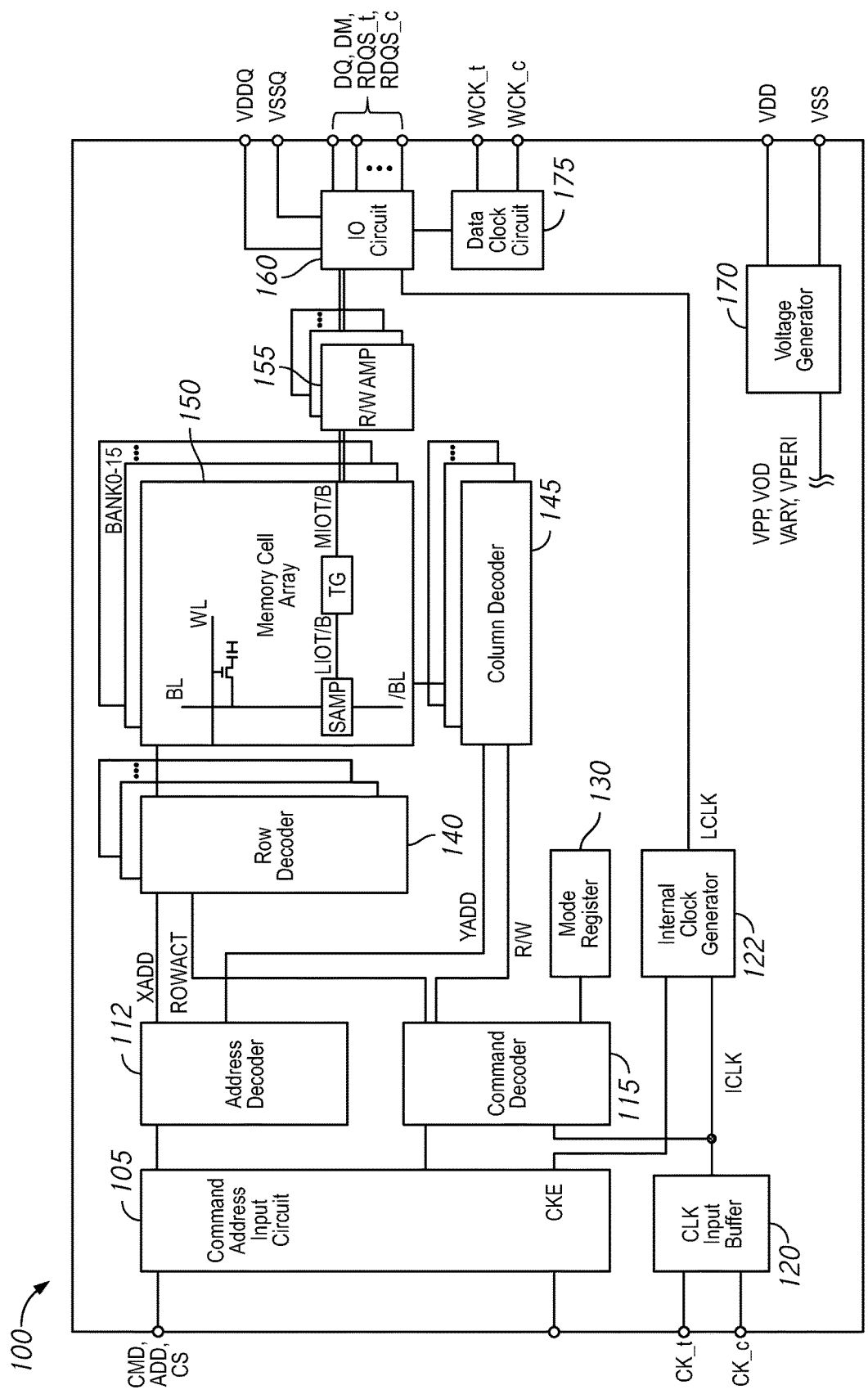
FIG. 1 is a block diagram of an apparatus according to at least one embodiment of the disclosure.

FIG. 1 is a block diagram of an apparatus according to at least one embodiment of the disclosure. The apparatus may be a semiconductor device 100, and will be referred to as such. The semiconductor device 100 may include, without limitation, a DRAM device. The semiconductor device 100 may be integrated into a single semiconductor chip in some embodiments of the disclosure.

The semiconductor device 100 includes a memory array 150. The memory array 150 is shown as including a plurality of memory banks. In the embodiment of FIG. 1, the memory array 150 is shown as including sixteen memory banks BANK0-BANK15, however memory array 150 may have more or fewer memory banks in other examples (e.g., 4, 8, 32). Each memory bank includes a plurality of word lines WL, a plurality of bit lines BL and /BL, and a plurality of memory cells MC arranged at intersections of the plurality of word lines WL and the plurality of bit lines BL and /BL. Selection of the word line WL is performed by a row decoder 140 and selection of the bit lines BL and /BL is performed by a column decoder 145. In the embodiment of FIG. 1, the row decoder 140 includes a respective row decoder for each memory bank and the column decoder 145 includes a respective column decoder for each memory bank. The bit lines BL and /BL (e.g., digit lines) are coupled to a respective sense amplifier (SAMP). Read data from the bit line BL or/BL is amplified by the sense amplifier SAMP, and transferred to read/write amplifiers 155 over complementary local data lines (LIOT/B), transfer gate (TG), and complementary main data lines (MIOT/B). Conversely, write data outputted from the read/write amplifiers 155 is transferred to the sense amplifier SAMP over the complementary main data lines MIOT/B, the transfer gate TG, and the complementary local data lines LIOT/B, and written in the memory cell MC coupled to the bit line BL or /BL.

In some applications, the number of sense amplifiers for each bank may equal a number of columns in each bank. Although only one sense amplifier SAMP is shown in FIG. 1, semiconductor device 100 may include hundreds or thousands of sense amplifiers. The sense amplifiers may be in close proximity to one another to reduce the layout size of semiconductor device 100. Certain devices of the sense amplifiers may share contacts. For example, pull-up and/or pull-down circuits may include components that share one or more contacts. The shared contacts may each include a local activation line that may provide a signal, which may be a voltage signal in some applications, to the components with the shared contact. The individual local lines may be coupled to a global activation line. The global activation line may provide a common activation signal (e.g., an activation voltage) to the local activation lines. In some situations, changes to the voltage level of the activation signal on one or more of the local activation lines may affect the voltage level of the activation signal on the global activation line, and changes to the voltage level on the global activation line may affect voltages on the local activation lines. Thus, changes in voltage levels on one or more of the local activation lines may affect voltage levels on one or more of the other local activation lines via the local activation lines' impact on the voltage of the global line. The influence of voltage levels of local activation lines on the voltage levels of other local activation lines may not always be desirable.

According to embodiments of the present disclosure, the shared contacts may include resistance between the local activation lines and the global activation line. The resistance may reduce or eliminate voltage changes on local lines due to voltage changes on other local activation lines and/or the global activation line. In some embodiments, the shared contact may include one or more components to provide the resistance between the local and global activation lines. In some embodiments, the shared contact may include a transistor, a resistor, and/or a resistive material.

In some embodiments, N-channel devices (which in some embodiments may implement pull-down circuits) of a same sense amplifier and/or N-channel devices of different (e.g., adjacent) sense amplifiers may include shared contacts that couple the N-channel devices to a global row Nsense latch signal (RNL) line. The RNL signal may be a voltage signal that provides an activation voltage that activates the N-channel devices. During a sense operation, amplification of voltage differences between respective pairs of digit lines may cause the N-channel devices to discharge voltage to the global RNL line, which may, at least temporarily, alter the voltage on the global RNL line. The change in voltage on the global RNL line may interfere with the sense operations of one or more other sense amplifiers. This may lead to increased sensing times and/or sensing errors.

Continuing the example of shared N-channel device contacts, the shared contact may include a "local" RNL line that is coupled to the global RNL line. The shared contact may include a resistance between the local RNL line and the global RNL line. The resistance may reduce the impact of voltage changes on the local RNL lines from affecting the voltage on the global RNL line and reduce the impact of voltage changes on the global RNL line from affecting one or more local RNL lines. Reducing the impact of voltage changes of sense amplifiers have on other sense amplifiers may reduce sensing errors of the sense amplifiers, such as sense amplifier SAMP of semiconductor device 100.

The semiconductor device 100 may employ a plurality of external terminals that include command and address and chip select (CA/CS) terminals coupled to a command and address bus to receive commands and addresses, and a CS signal. The external terminals may further include clock terminals to receive clocks CK_t and CK_c, and data clocks WCK_t and WCK_c, and to provide access data clocks RDQS_t and RDQS_c, data terminals DQ, data mask terminal DM, and power supply terminals to receive power supply potentials VDD, VSS, VDDQ, and VSSQ.

The clock terminals are supplied with external clocks CK_t and CK_c that are provided to an input buffer 120. The external clocks may be complementary. The input buffer 120 generates an internal clock ICLK based on the CK_t and CK_c clocks. The ICLK clock is provided to the command decoder 115 and to an internal clock generator 122. The internal clock generator 122 provides various internal clocks LCLK based on the ICLK clock. The LCLK clocks may be used for timing operation of various internal circuits. Data clocks WCK_t and WCK_c are also provided to the external clock terminals. The WCK_t and WCK_c clocks are provided to a data clock circuit 175, which generates internal data clocks based on the WCK_t and WCK_c clocks. The internal data clocks are provided to the input/output circuit 160 to time operation of circuits included in the input/output circuit 160 to time the receipt of write data.

The CA/CS terminals may be supplied with memory addresses. The memory addresses supplied to the CA/CS terminals are transferred, via a command/address input circuit 105, to an address decoder 112. The address decoder 112 receives the address and supplies a decoded row address XADD to the row decoder 140 and supplies a decoded column address YADD to the column decoder 145. The CA/CS terminals may be supplied with commands. Examples of commands include access commands for accessing the memory, such as read commands for performing read operations and write commands for performing write operations, mode register write and read commands for performing mode register write and read operations, as well as other commands and operations.

The commands may be provided as internal command signals to a command decoder 115 via the command/address input circuit 105. The command decoder 115 includes circuits to decode the internal command signals to generate various internal signals and commands for performing operations. For example, the command decoder 115 may provide a row command signal ROWACT to select a word line and a column command signal R/W to select a bit line.

The power supply terminals are supplied with power supply potentials VDD and VSS. The power supply potentials VDD and VSS are supplied to an internal voltage generator circuit 170. The internal voltage generator circuit 170 generates various internal potentials VPP, VOD, VARY, VPERI, and the like based on the power supply potentials VDD and VSS supplied to the power supply terminals. The internal potential VPP is mainly used in the row decoder 140, the internal potentials VOD and VARY are mainly used in the sense amplifiers SAMP included in the memory array 150, and the internal potential VPERI is used in many peripheral circuit blocks.

The power supply terminals are also supplied with power supply potentials VDDQ and VSSQ. The power supply potentials VDDQ and VSSQ are supplied to the input/output circuit 160. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 160 so that power supply noise generated by the input/output circuit 160 does not propagate to the other circuit blocks.

When an activate command and a row address are received, followed by a read command and a column address, read data is read from memory cells in the memory array 150 corresponding to the row address and column address. The read command is received by the command decoder 115, which provides internal commands so that read data from the memory array 150 is provided to the read/write amplifiers 155. The read data is provided to the input/output circuit 160 and output to the data terminals DQ. When an activate command and a row address are received, followed by a write command and a column address, write data supplied to the data terminals DQ is written to a memory cells in the memory array 150 corresponding to the row address and column address. A data mask may be provided to the data mask terminals DM to mask portions of the data when written to memory. The write command is received by the command decoder 115, which provides internal commands so that the write data is received by input receivers in the input/output circuit 160. The write data is supplied from the data terminals DQ via the input/output circuit 160 to the read/write amplifiers 155, and by the read/write amplifiers 155 to the memory array 150 to be written into the memory cell MC. In some examples, the DQ map may be selected. Read and write may be provided to the DQ terminals connection with one or more clock signals, such as data clocks WCK_t and WCK_c, and to provide access data clocks RDQS_t and RDQS_c.

Figure 2:
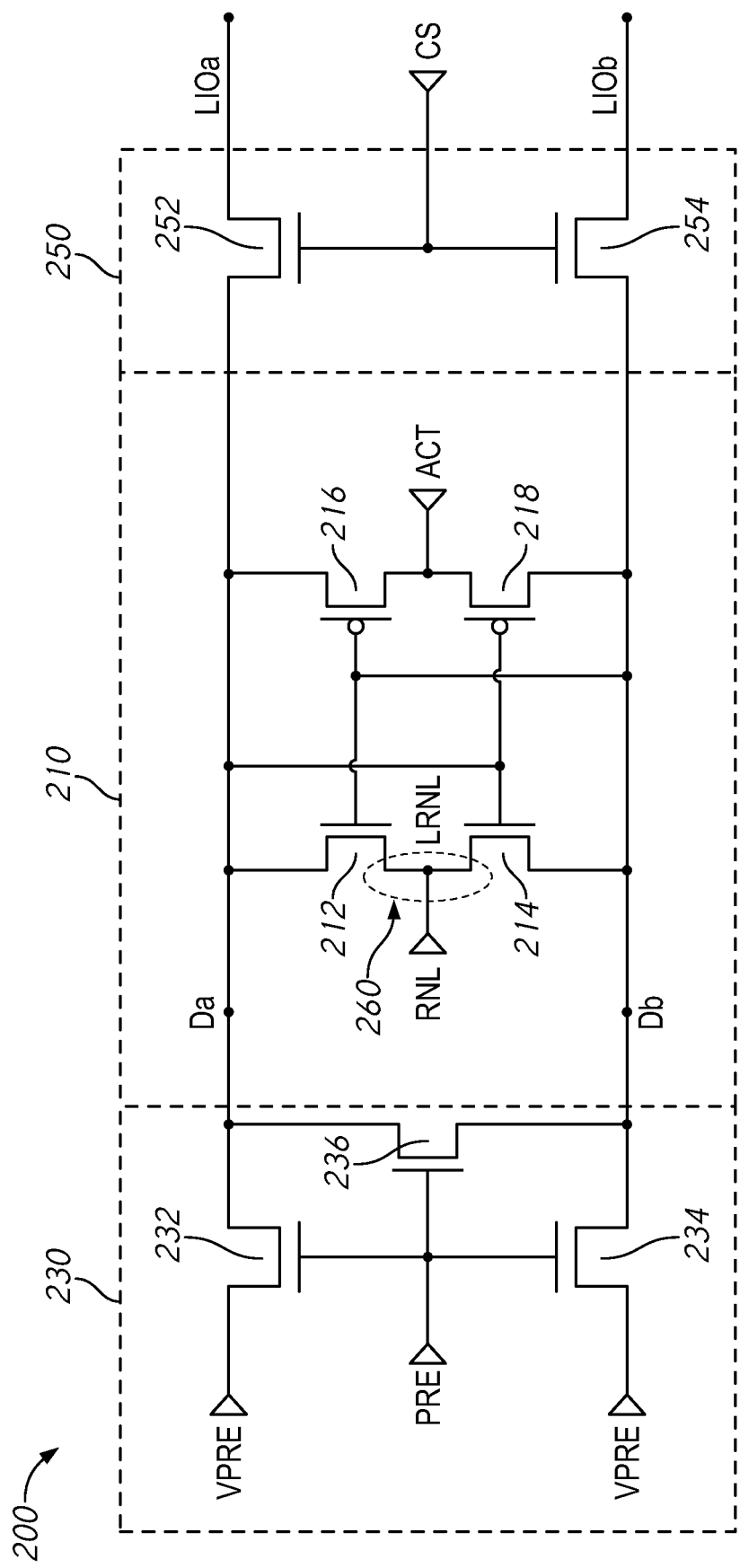
FIG. 2 is a circuit diagram of an exemplary sense amplifier circuit that may be used in at least one embodiment of the disclosure.

FIG. 2 is a circuit diagram of an exemplary sense amplifier circuit that may be used in at least one embodiment of the disclosure. In some embodiments, the sense amplifier 200 may be used to implement sense amplifier SAMP in FIG. 1. The sense amplifier circuit 200 is provided merely for explanatory purposes, and the embodiments of the disclosure are not limited to the particular sense amplifier shown in FIG. 2. Other sense amplifiers may also be used to implement the sense amplifier SAMP without departing from the scope of the present disclosure, for example, the sense amplifiers described in U.S. Pat. Nos. 10,153,007 and 10,586,586, which are incorporated herein by reference for any purpose.

The sense amplifier circuit 200 includes a sense amplifier 210, a precharge circuit 230, and a column select circuit 250. When activated, the sense amplifier 210 is configured to sense a difference (e.g., voltage, current) between nodes Da and Db, to which a differential pair of digit lines may be coupled. The sense amplifier 210 may be activated by active sense amplifier activation signals ACT and RNL. The sense amplifier 210 includes pull-down circuits 212, 214 and pull-up circuits 216, 218. Gates of the pull-down and pull-up circuits 212 and 216 are coupled to node Db, and gates of the pull-down and pull-up circuits 214 and 218 are coupled to node Da.

The precharge circuit 230 is configured to precharge the nodes Da and Db to a precharge voltage VPRE responsive to an active PRE signal. The precharge circuit 230 includes precharge switches 232 and 234 having gates coupled to receive the PRE signal. The precharge circuit 230 may further include an equilibration switch 236 having a gate coupled to receive the PRE signal. When the switches 232, 234, and 236 are activated by an active PRE signal, the VPRE voltage is coupled to the nodes Da and Db through the precharge switches 232 and 234, and the Da and Db nodes are coupled together to equalize the voltage. The nodes Da and Db are typically precharged and equilibrated in preparation for a sense operation by the sense amplifier 210. The column select circuit 250 is configured to couple the sense amplifier 210 to the LIOa and LIOb lines through column select switches 252 and 254 responsive to an active column select signal CS. The CS signal may be provided by a column decoder that provides an active CS signal to couple a sense amplifier corresponding to a column address to the LIOa and LIOb lines.

The pull-down switches 212 and 214, the precharge switches 232 and 234, equilibration switch 236, and the column select switches 252 and 254 are illustrated in FIG. 2 as N-channel field effect transistors (NFETs), and the pull-up transistors 216 and 218 are illustrated in FIG. 2 as P-channel field effect transistors (PFETs). Other circuits or transistor types may be used as well for these switches In operation, an active PRE signal is provided to the precharge circuit 230 to precharge nodes Da and Db to the VPRE voltage prior to the sense amplifier 210 being activated. The precharge switches 232 and 234, and the equilibration switch 236 are deactivated by the PRE signal becoming inactive, allowing the nodes Da and Db to float at the VPRE voltage. A memory cell is then coupled to a digit line that is coupled to node Da or Db. The memory cell may be coupled to the digit line, for example, responsive to a wordline being activated. In the present example operation, it is assumed that the digit line is coupled to the node Da and the memory cell stores a "1" bit of data, (e.g., stores some charge).

As a result of the memory cell being coupled to the digit line (which is coupled to node Da), the charge of the memory cell is shared with node Da. An active ACT signal (active high) and an active RNL (active low) signal are provided to activate the sense amplifier 210. The pull-down transistor 214 begins to become conductive due to the charge on node Da, thus pulling node Db down to the low voltage of the RNL signal. The pull-up transistor 216 begins to become conductive as the node Db is pulled down, thus pulling up node Da to the high voltage of the ACT signal. The positive feedback of pulling up node Da and pulling down node Db results in the node Da being pulled up to the voltage of the ACT signal and the node Db being pulled down to the voltage of the RNL signal.

After the nodes Da and Db are sufficiently split (e.g., having a voltage difference), an active CS signal is provided to activate the column select circuit 250 of the sense amplifier circuit 200 coupled to the memory cell being accessed. The activated column select circuit 250 couples the nodes Da and Db to the LIOa and LIOb lines, respectively, to provide the voltage of the ACT signal to the LIOa line and the voltage of the RNL signal to the LIOb line. The LIOa and LIOb lines are then coupled to main IO lines to the global IO lines (e.g., to provide data to the read write amplifiers 155).

The sense amplifier circuit 200 may be one of hundreds or thousands of sense amplifier circuits in a semiconductor device, such as semiconductor device 100. In some embodiments, the sense amplifier circuit 200 may include one or more components that share a contact. For example, pull-down circuits 212, 214 may share a contact as indicated by oval 260. The shared contact may include an area or volume of conductive material, one or more conductive traces, wires, or a combination thereof. The shared contact may couple the pull-down circuits 212, 214 to the RNL signal. The shared contact between the pull-down circuits 212, 214 may include a local RNL (LRNL) line that provides the RNL signal to the pull-down circuits 212, 214. The RNL signal may be provided to the local RNL line via the shared contact by a global RNL line that provides the RNL signal (e.g., an common activation voltage) to multiple sense amplifiers (e.g., all of the sense amplifiers of a memory mat, all of the sense amplifiers of a memory bank, such as BANK0-15, or all of the sense amplifiers of a semiconductor device).

Memory cells of a memory array may vary in the amount of charge stored, rate of discharge, and/or amount discharged. The variations may be due to process, fabrication, temperature, and/or other inconsistencies. These variations may lead to different strengths in signals provided by the memory cells to the sense amplifiers. Thus, a "strong" value provided by a memory cell means the memory cell provides a stronger than average signal to the sense amplifier and a "weak" value provided by the memory cell means the memory cell provides a weaker than average signal to the sense amplifier.

As discussed, the RNL signal may be active low. Thus, the global RNL line provides a common low voltage to the sense amplifiers and may act as a drain for voltages received from the pull-down circuits 212, 214 during the sense operation. Theoretically, the global RNL line maintains the common low voltage for the sense amplifiers when the RNL signal is low. However, sense amplifiers sensing '1' values from memory cells, particularly strong '1' values, may "dump" voltage onto the global RNL line. This may, at least temporarily, raise the voltage of the global RNL line, which in turn may raise the voltage of the local RNL lines. This increase in the global RNL line voltage is referred to as an RNL loading effect. In some instances, the increased voltage of the RNL signal provided to pull-down circuits 212, 214 may cause interference with the sense amplifier circuit 300's ability to sense a value from a memory cell, particularly a weak '0.'

The result of the RNL loading effect may be that the higher voltage associated with '1' may be sensed faster by the sense amplifiers while the lower voltage associated with '0' may be sensed later by the sense amplifiers. Thus, a sense amplifier sensing a '1' may sense the value faster than a sense amplifier sensing a '0' value. This may cause sensing errors in some cases. Furthermore, in some cases, rapidly changing voltages due to the sense operation may be more likely to create interference between interconnects within and/or between sense amplifiers than more slowly changing voltages. For example, a rapidly changing voltage responsive to a strong '1' value accelerated due to the RNL loading effect may cause destructive interference on another sense amplifier (e.g., a sense amplifier sensing a weak '0'), causing an erroneous value to be sensed.

Figure 3:
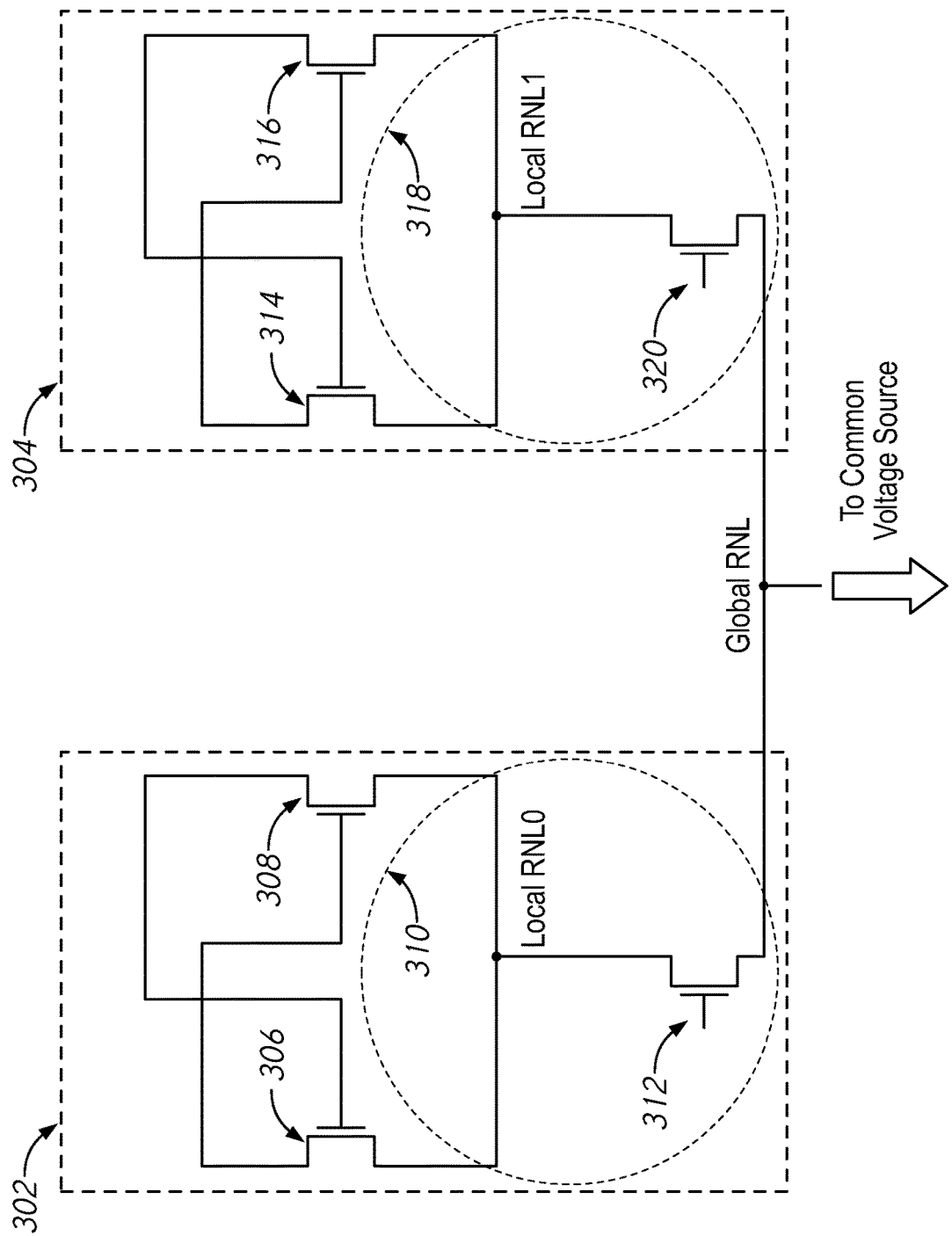
FIG. 3 is a diagram of at least portions of sense amplifiers, local RNL lines, and a global RNL line according to at least one embodiment of the disclosure.

FIG. 3 is a diagram of at least portions of sense amplifiers, local RNL lines, and a global RNL line according to at least one embodiment of the disclosure. While only two sense amplifiers 302, 304 are shown in FIG. 3, it is understood that a semiconductor device may have many (e.g., tens, hundreds, thousands) of sense amplifiers. In some embodiments, each of the sense amplifiers 302, 304 may include sense amplifier circuit 200. However, only two devices having a shared contact are illustrated in sense amplifiers 302, 304, and the additional components and connections of the sense amplifiers 302, 304 have been omitted. In the example provided in FIG. 3, N-channel devices 306 and 308 coupled to a shared contact indicated by oval 310 are illustrated in sense amplifier 302 and N-channel devices 314 and 316 coupled to a shared contact indicated by oval 318 are illustrated in sense amplifier 304. In some embodiments, devices 306, 308 and devices 314, 316 may correspond to pull-down circuits 212, 214.

While the shared contacts are indicated by ovals 310 and 318, the shared contacts may include an area of conductive material and/or one or more conductive traces, such as the conductive traces shown coupled to the devices 306, 308 and 314, 316, and further coupled to transistors 312 and 320, respectively. The shared contacts may include local RNL lines. The shared contacts may include transistors 312 and 320 in some embodiments. As shown in FIG. 3, the shared contact of sense amplifier 302 includes local RNL line RNL0 and transistor 312 and the shared contact of sense amplifier 304 includes local RNL line RNL1 and transistor 320.

The local RNL lines RNL0 and RNL1 are coupled to a global RNL line, which is coupled to a common voltage source (not shown) to provide a common voltage RNL signal to sense amplifiers 302 and 304. In contrast to FIG. 2, the local RNL lines RNL0 and RNL1 are not directly coupled to the global RNL line, but rather are coupled by transistor 312 and transistor 320, respectively, included with the shared contacts. In FIG. 3, transistors 312 and 320 are shown as NFETs, but other circuits and/or devices may be used in other embodiments. Voltages may be applied to the gates of the transistors 312, 320 by a voltage generator, such as voltage generator 270. The voltages applied to the gates of the transistors 312, 320 may be varied to change the resistivity of the transistors 312, 320. For example, as the resistivity of the transistors 312, 320 is increased, the local RNL lines RNL0, RNL1 may be partially or fully isolated from the global RNL line. This may reduce the loading effect on the global RNL line and/or reduce the impact of the loading effect on the local RNL lines RNL0, RNL1. While the embodiment shown in FIG. 3 may reduce sensing errors by sense amplifiers 302, 304 in some applications, providing individual transistors to provide resistance between the local RNL lines and the global RNL line may not be practical. For example, the additional transistors may unacceptably increase the layout area of the sense amplifiers and/or RNL lines. Furthermore, controlling the transistors may require additional control logic, voltage sources, and/or power consumption.

Figure 4:
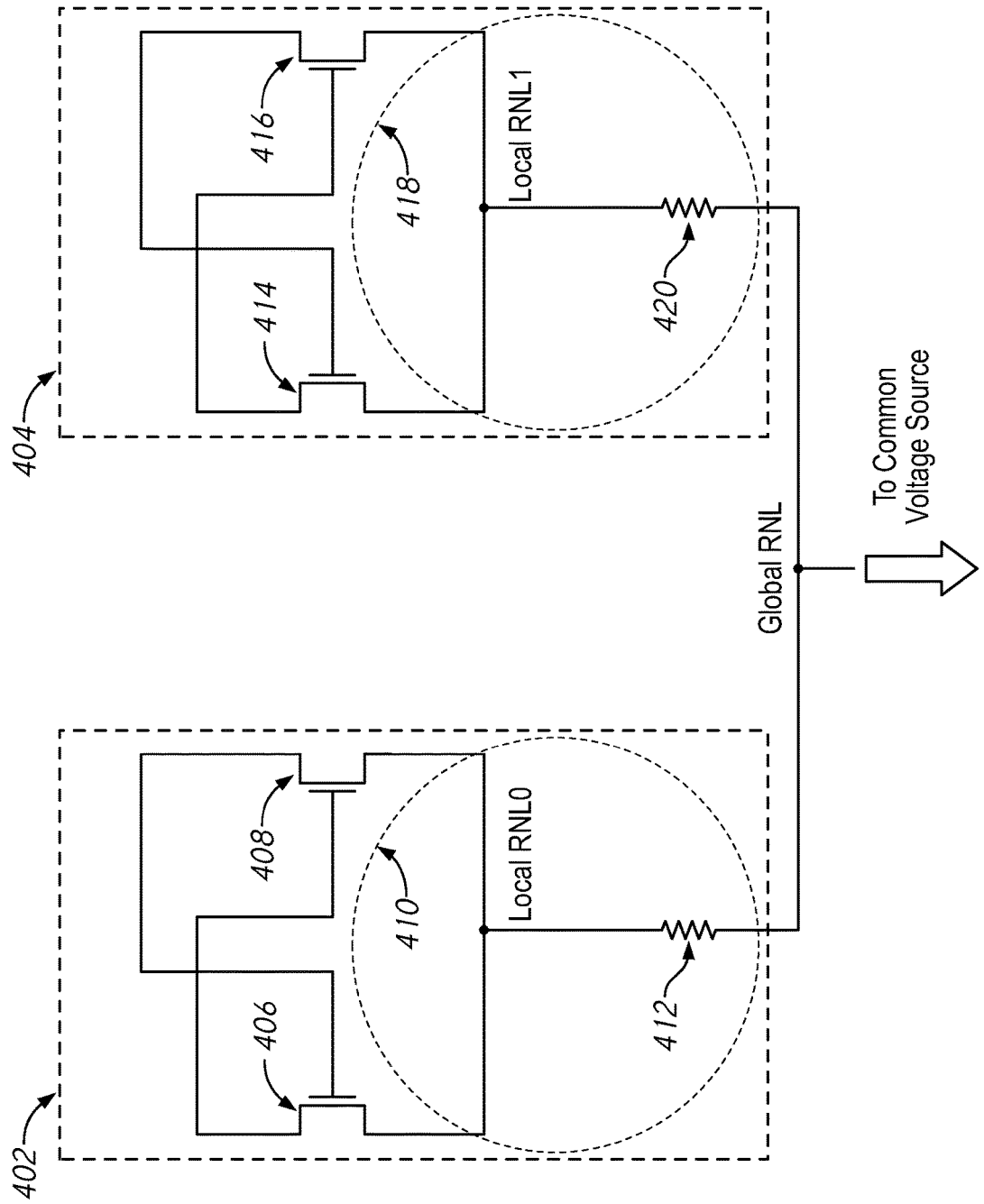
FIG. 4 is a diagram of at least portions of sense amplifiers, local RNL lines, and a global RNL line according to at least one embodiment of the disclosure.

FIG. 4 is a diagram of at least portions of sense amplifiers, local RNL lines, and a global RNL line according to at least one embodiment of the disclosure. While only two sense amplifiers 402, 404 are shown in FIG. 4, it is understood that a semiconductor device may have many (e.g., tens, hundreds, thousands) of sense amplifiers. In some embodiments, each of the sense amplifiers 402, 404 may include sense amplifier circuit 400. However, only two devices having a shared contact are illustrated in sense amplifiers 402, 404, and the additional components and connections of the sense amplifiers 402, 404 have been omitted. In the example provided in FIG. 4, N-channel devices 406 and 408 coupled to a shared contact indicated by oval 410 are illustrated in sense amplifier 402 and N-channel devices 414 and 416 coupled to a shared contact indicated by oval 418 are illustrated in sense amplifier 404. In some embodiments, devices 406, 408 and devices 414, 416 may correspond to pull-down circuits 212, 214.

While the shared contacts are indicated by nodes 410 and 418, the shared contacts may include an area of conductive material, and/or one or more conductive traces, such as the conductive traces coupled to the devices 406, 408 and 414, 416, and further coupled to resistances 412 and 420. The shared contacts may include local RNL lines. The shared contacts may include the resistances 412 and 420 in some embodiments. As shown in FIG. 4, the shared contact of sense amplifier 402 includes local RNL line RNL0 and resistance 412, and the shared contact of sense amplifier 404 includes local RNL line RNL1 and resistance 420.

The local RNL lines RNL0 and RNL1 are coupled to a global RNL line, which is coupled to a common voltage source (not shown) to provide a common voltage RNL signal to sense amplifiers 402 and 404. Similar to FIG. 3, the local RNL lines RNL0 and RNL1 are not directly coupled to the global RNL line, but rather are coupled through resistance 412 and resistance 420, respectively. Although illustrated as resistors in FIG. 4, the resistances 412, 420 may be implemented by any suitable resistance. For example, a resistive material may be included in the shared contacts of the N-channel devices 406, 408 and 414, 416 in some embodiments. In some embodiments, a material may be deposited in at least a portion of the shared contact and/or a portion of the shared contact may be doped with a material that increases a resistance of the shared contact. In some embodiments, the resistive material may be included in a shared common diffusion connection between the N-channel devices. However, the resistance may not be added to the diffusion region itself in some embodiments because in some embodiments, added resistance in the diffusion region may affect the potential "seen" by one or more of the N-channels, and the N-channels may not "see" the same potential if the resistance is added to the diffusion region. In some embodiments, the resistive material may be included in an added interface layer. In some embodiments, the resistive material may be included in a shared contact structure (e.g., in the conductive trace). Other techniques for adding resistance to the shared contacts may be used in other examples.

In some embodiments, the resistances 412, 420 may require less layout area, power, and/or additional circuitry compared to transistors 312, 320. The resistances 412, 420 may mitigate the RNL loading effect and its impacts on individual sense amplifiers to an extent that sensing errors are reduced or eliminated. Thus, in some small layout and/or low power applications, the embodiment shown in FIG. 4 may be preferable, and in some applications where the RNL loading effect may not be tolerated, the embodiment shown in FIG. 3 may be preferable.

Although the examples shown in FIGS. 2-4 show the pull-down circuits of a same sense amplifier having a shared contact coupled to the global RNL line, in other embodiments, a pull-down circuit of different sense amplifiers (e.g., adjacent sense amplifiers) may share a contact. In these embodiments, the local RNL line may be shared between two different sense amplifiers.

Figure 5:
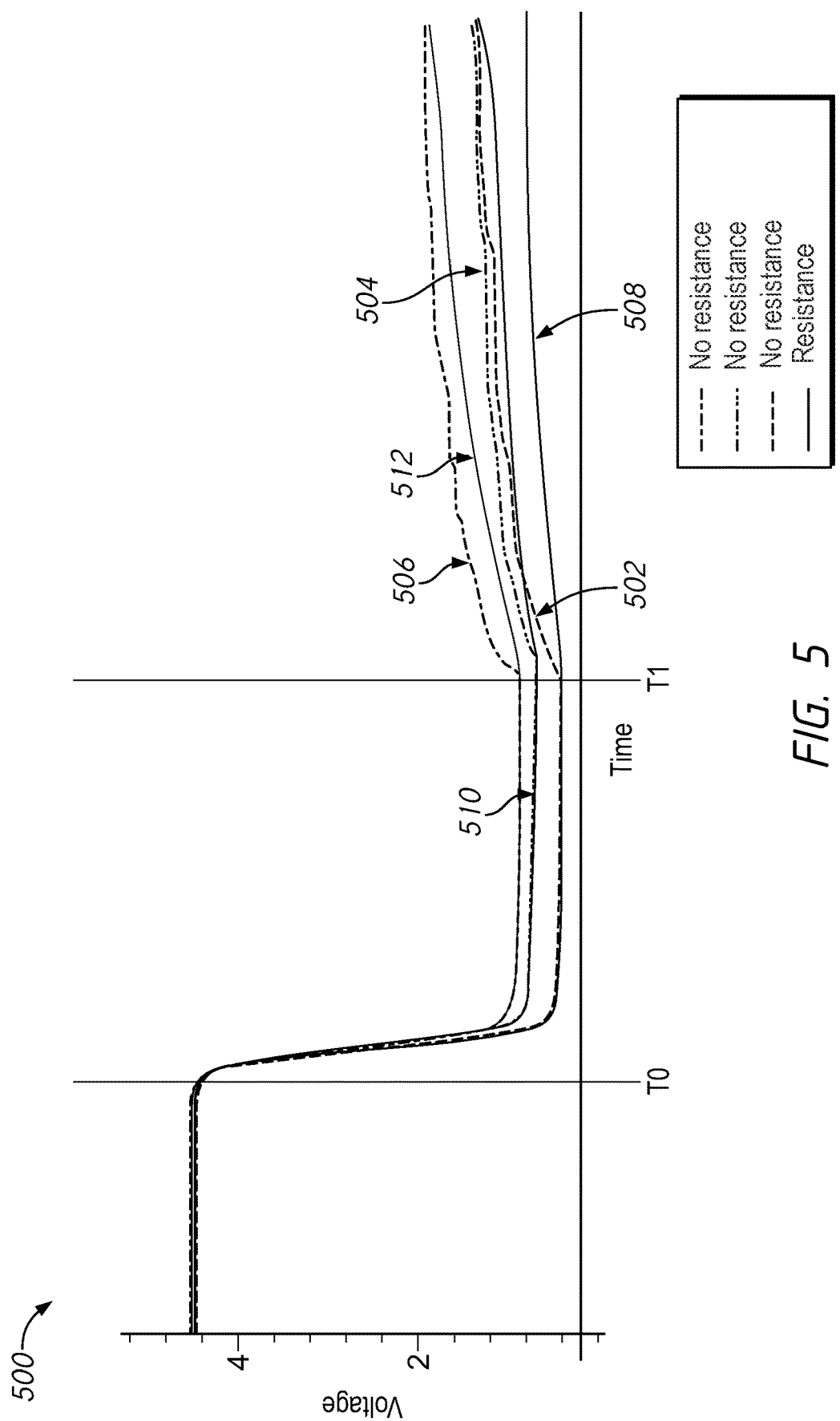
FIG. 5 is a plot of exemplary voltage levels of local and global RNL lines over time according to at least one embodiment of the present disclosure.

FIG. 5 is a plot of exemplary voltage levels of local and global RNL lines over time according to at least one embodiment of the present disclosure. The voltage curves are illustrative and do not necessarily correspond to actual voltage levels of RNL lines, such as RNL lines shown in FIGS. 2-4.

Plot 500 illustrates voltages over time for a global RNL line at curve 502, a local RNL line at curve 504, and another local RNL line at curve 506 when there is no isolation between the global and local RNL lines. Plot 500 further illustrates voltages over time for the global RNL line at curve 508, the local RNL line at curve 510, and the other local RNL line at curve 512 when a resistance is provided between the local RNL lines and the global RNL. In the example shown in FIG. 5, the local RNL line represented by curves 504 and 510 is coupled to a sense amplifier sensing a weak '0' and the local RNL line represented by curves 506 and 512 is coupled to a sense amplifier sensing a strong '1.'

At or around a time T0, as part of a sense operation, an RNL signal is transitioned to active low as described with reference to FIG. 2. Responsive to the low RNL signal, the voltage on the global RNL line decreases as indicated by curves 502 and 508. The decrease in voltage in the global RNL line decreases the voltage of the local RNL lines in both cases with and without resistance between the global and local RNL lines as shown by curves 504, 506, 510, and 512. Between times T0 and T1, curve 510 is lower than curve 512 due, at least in part, to the sense amplifier associated with curve 510 is sensing a lower digit than the sense amplifier associated with curve 512.

In some embodiments, at or around time T1, the ACT signal may be activated as described with reference to FIG. 2. However, in some embodiments, the ACT signal may be activated at or around time T0. In some embodiments, the ACT signal may be activated simultaneously or near simultaneously with the RNL signal. However, in some applications, it may be advantageous to activate the RNL signal prior to the ACT signal.

At or around time T1, the effect of at least partially isolating the global and local RNL lines becomes visible. The local RNL line coupled to the sense amplifier sensing a strong '1' begins increasing in voltage. While both curves 506 and 512 illustrate an increase in voltage responsive to the strong '1,' curve 506 shows a greater increase in voltage when there is no resistance between the local RNL line and the global RNL line. As indicated by curves 502 and 508, the global RNL line also increases in voltage due in part to the local RNL line sensing the strong '1' dumping voltage onto the global RNL line, causing the RNL loading effect. When there is no resistance between the global and local RNL lines, more voltage is dumped onto the global RNL line as indicated by curve 502 in comparison to curve 508. This increase in voltage on the global RNL line shown by curve 502 exacerbates the increase in voltage on the local RNL line as shown by the difference in curves 506 and 512.

The other local RNL line coupled to the sense amplifier detecting a weak '0' is also affected by the sense amplifier detecting the strong '1.' When the voltage on the global RNL line increases due to the RNL loading effect, the voltage of the other local RNL line also increases as indicated by curves 504 and 510. However, when the other local RNL line is coupled via a resistance to the global RNL line, as shown by curve 510, the voltage of the other local RNL line does not increase to the same extent as when there is no resistance present between the local and global RNL lines.

As illustrated by the curves in FIG. 5, at least partially isolating the local RNL lines and the global RNL lines may reduce the impact of voltage changes of a local RNL line on the global RNL line. Providing resistance between the local RNL lines and the global RNL lines may reduce the impact of voltage changes on the global RNL line on local RNL lines. Thus, sense amplifiers sensing strong '1' values may be less likely to impact sense amplifiers sensing weak '0' values.

Figure 6:
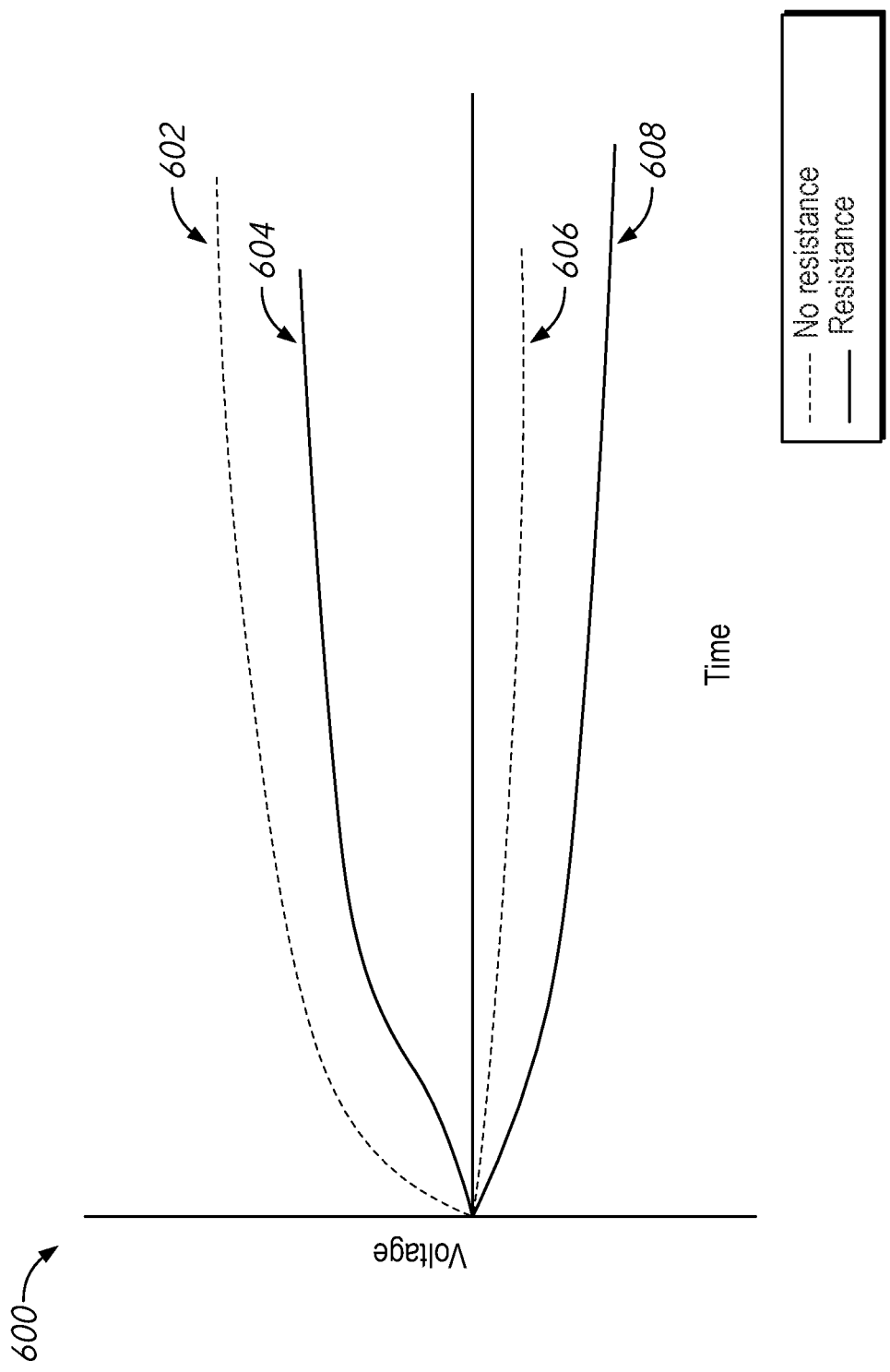
FIG. 6 is a plot of exemplary voltages amplified by sense amplifiers according to at least one embodiment of the present disclosure.

FIG. 6 is a plot of exemplary voltages amplified by sense amplifiers according to at least one embodiment of the present disclosure. The voltage curves are illustrative and do not necessarily correspond to actual voltage levels provided by sense amplifiers, such as sense amplifiers shown in FIGS. 1-4. In the example shown in FIG. 6, the curves 602 and 604 represent a voltage provided by a sense amplifier sensing a strong '1' value from a memory cell and curves 606 and 608 represent a voltage provided by a sense amplifier sensing a weak '0' value from a memory cell. Curves 602 and 606 represent voltages when there is no isolation between local RNL lines coupled to the sense amplifiers and a global RNL line. Curves 604 and 608 represent voltages when there is at least partial isolation between the local RNL lines and the global RNL line.

As discussed with reference to FIG. 5, when a sense amplifier senses a strong '1' value, it may dump voltage onto the global RNL line, increasing the voltage of the global RNL line, referred to as the RNL loading effect. In addition to raising the voltage of local RNL lines, the increased voltage of the global RNL line may accelerate the sensing of strong '1' values by the sense amplifiers. This is indicated by the steeper slope of curve 602 in comparison to curve 604. In some applications, rapid increases in voltages, such as those indicated by curve 602 may be more likely to trigger coupling between sense amplifiers and/or components within a sense amplifier. The coupling may cause destructive interference, which may lead to sensing errors.

Further, increases in voltage on the global RNL line may increase voltage of local RNL lines coupled to sense amplifiers sensing weak '0' values. The increase in voltage on the local RNL lines may delay the sensing of weak '0' values as indicated by the reduced slope of curve 606 compared to curve 608. This may increase the time required to sense weak '0' values in some applications. In some applications, the weaker signals may be more difficult to detect and/or more susceptible to interference, which may lead to sensing errors.

Curves 604 and 608 illustrate how adding a resistance to a shared contact between two components of a sense amplifier or adjacent sense amplifiers between the local and global RNL lines and the global RNL line, such as by adding a resistor, resistive material, and/or a transistor, may mitigate the effects of the RNL loading effect. Curve 604 increases in voltage at a slower rate than curve 602, indicating that providing resistance between local and global RNL lines may reduce the risk of cross-coupling. In contrast, the curve 608 provides a stronger signal for detecting a weak '0' sooner in time compared to curve 606. Thus, providing resistance between the local and global RNL lines may reduce sensing delays and/or provide stronger signals for sensing.

Although the examples disclosed herein may, in some applications, impact voltages on the global RNL line, this may not be necessary in all examples, or a motivation for applying the embodiments disclosed herein in all applications. In some applications, the addition of a resistance at the shared contact may reduce the voltage level of the global RNL due, at least in part, to reducing a peak of a current during a sense operation due to the additional resistance. For example, a higher a bit at the time of a sensing operation, then the more current that sense amplifier may provide the global RNL. This may raise the effective global RNL voltage. The sense amplifier with digits at a lower voltage may not conduct as well, due at least in part, because the global RNL voltage is higher and so that sense amplifier will not amplify as soon or readily. By isolating the local RNLs, the local RNL at each sense amplifier may seek the level set by the digit lines. Thus, the sense amplifiers may start to amplify at the digit line level presented to the sense amplifier, regardless of level.

When resistance is added, the global RNL may have a lower voltage level due, at least in part, because the overall impedance of the RNL network may be increased. This may result in one or more of the sense amplifiers having less current, and this may slow sensing of high digit line levels (e.g., strong memory cell), but may also reduce noise transferred to sense amplifiers with slower ramp rates sensing weak digit line levels. Thus, while fast sense amplifiers (e.g., sense amplifiers sensing strong memory cells) are slowed but the weak sense amplifiers (e.g., sense amplifiers sensing weak memory cells) are improved, which may result in a net benefit.

Although examples provided herein describe differences between sensing strong '1' and weak '0,' the disclosure is not limited to sensing of these values. While the example of a strong '1' and a weak '0' by sense amplifiers may represent a "worst case scenario" for the RNL loading effect, other values (e.g., weak '1,' strong '0,' average range '1' and '0' values, etc.) may also be sensed by the sense amplifiers without departing from the scope of the present disclosure.

The systems, methods and apparatuses disclosed herein may reduce voltage changes on a global activation line responsive to voltage changes on local activation lines of sense amplifiers when sensing data from digit lines, and reduce the influence of voltage changes on the global line on local activation lines. In some applications, this may reduce sensing errors.

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

What is claimed is:

1. An apparatus, comprising:
a plurality of sense amplifiers;
a plurality of shared contacts, wherein individual ones of the plurality of shared contacts are coupled between at least two components of a sense amplifier of the plurality of sense amplifiers or between at least one component of a first sense amplifier of the plurality of sense amplifiers and at least one component of a second sense amplifier of the plurality of sense amplifiers, and wherein the individual ones of the plurality of shared contacts comprise a local line and a resistance; and
a global line coupled to the local line via the resistance of corresponding ones of the plurality of shared contacts, wherein the resistance at least partially isolates the local lines of the individual ones of the plurality of shared contacts from the global line causing each of the plurality of sense amplifiers to be at least partially isolated from one another.

2. The apparatus of claim 1, wherein the resistance comprises a transistor coupled between the local line and the global line.

3. The apparatus of claim 2, wherein the transistor is configured to receive a voltage at a gate of the transistor, wherein a resistivity of the transistor varies with the voltage applied.

4. The apparatus of claim 1, wherein individual ones of the plurality, of shared contacts comprise a resistor coupled between the local line and the global line.

5. The apparatus of claim 1, wherein the resistance comprises a resistive material provided at the shared contact.

6. The apparatus of claim 1, wherein the at least two components of the sense amplifier or the at least one component of the first sense amplifier and the at least one component of the second sense amplifier comprise pull-down circuits of the sense amplifier.

7. The apparatus of claim 6, wherein at least one of the pull-down circuits comprises an N-channel device.

8. The apparatus of claim 1, wherein the global line is configured to provide a common voltage to the local lines of the plurality of shared contacts.

9. An apparatus comprising:
a first sense amplifier;
a first shared contact coupled between at least two components of the first sense amplifier, wherein the first shared contact comprises a local line and a resistance; and
a global line coupled to the local line, wherein the resistance is coupled between the local line and the global line and wherein the resistance at least partially isolates the local line from the global line causing the first shared contact of the first sense amplifier to be at least partially isolated from a second shared contact of a second sense amplifier.

10. The apparatus of claim 9, wherein resistance comprises a transistor coupled between the local line and the global line.

11. The apparatus of claim 9, wherein the resistance comprises a resistive material coupled between the local line and the global line.

12. The apparatus of claim 11, wherein the resistive material comprises a doped portion of the shared contact.

13. The apparatus of claim 9, wherein the local line comprises a local activation signal line and the global line comprises a global activation signal line.

14. The apparatus of claim 13, wherein the global activation signal line is configured to provide an active low activation voltage to the local activation signal line during at least a portion of a sense operation performed by the first sense amplifier.

15. The apparatus of claim 9, wherein at least one of the at least two components comprises an N-channel field effect transistor.

16. An apparatus comprising:
a plurality of shared contacts, individual ones of the shared contacts coupled to at least two components and comprising one of a corresponding plurality of local lines and one of a corresponding plurality of resistances; and
a global line coupled to individual ones of the plurality of local lines via individual ones of the plurality of resistances, wherein the global line is configured to provide a common voltage to the plurality of local line and wherein the plurality of resistances at least partially isolates the plurality of local lines from the global line causing the individual ones of the plurality of shared contacts to be at least partially isolated from one another.

17. The apparatus of claim 16, wherein the at least two components comprise pull-down circuits of a same sense amplifier.

18. The apparatus of claim 16, wherein the at least two components comprise pull-down circuits of adjacent sense amplifiers of a plurality of sense amplifiers.

19. The apparatus of claim 16, wherein individual ones of the plurality resistances comprise a transistor coupled between the corresponding plurality of local lines and the global line.

20. The apparatus of claim 16, wherein individual ones of the plurality resistances comprise a resistor, a resistive material, or a combination thereof coupled between the corresponding plurality of local lines and the global line.

* * * * *